United States Patent
Wu et al.

(10) Patent No.: US 10,707,551 B1
(45) Date of Patent: Jul. 7, 2020

(54) WIRELESS ROUTER AND WIRELESS DEVICE

(71) Applicant: NANNING FUGUI PRECISION INDUSTRIAL CO., LTD., Nanning (CN)

(72) Inventors: Kuan-Yi Wu, Hsinchu (TW); Chien-Min Hung, New Taipei (TW); Chia-Hung Hung, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 17 days.

(21) Appl. No.: 16/284,032

(22) Filed: Feb. 25, 2019

(51) Int. Cl.
  *H01Q 1/12* (2006.01)
  *H01Q 1/42* (2006.01)
  *H05K 1/11* (2006.01)
  *H01Q 1/22* (2006.01)
  *G07C 9/00* (2020.01)

(52) U.S. Cl.
  CPC ............. *H01Q 1/1221* (2013.01); *H01Q 1/22* (2013.01); *H01Q 1/428* (2013.01); *H05K 1/11* (2013.01); *G07C 9/00174* (2013.01)

(58) Field of Classification Search
  CPC ........ H01Q 1/1221; H01Q 1/428; H01Q 1/22; H05K 1/11; G07C 9/00174
  See application file for complete search history.

(56) References Cited

U.S. PATENT DOCUMENTS

| | | | | |
|---|---|---|---|---|
| 2007/0140230 A1* | 6/2007 | Beshai | ................. | H04L 49/103 370/360 |
| 2007/0247421 A1* | 10/2007 | Orsley | ................. | H01H 25/041 345/156 |

* cited by examiner

*Primary Examiner* — Marcos L Torres
(74) *Attorney, Agent, or Firm* — ScienBiziP, P.C.

(57) ABSTRACT

A wireless router that can be switched to operate at different wireless modes by repeated presses on a button includes a rotatable disk and a first printed circuit board. A first magnetic component and a first conductive sheet array are fixed on the rotatable disk. The first conductive sheet array includes first conductive sheets. A first and a second magnetic component arrays are fixed on the first printed circuit board. The first magnetic component array includes second magnetic components. The second conductive sheet array includes second conductive sheets. The wireless router is configured to be switched between wireless modes by rotating the rotatable disk to one of the wireless modes, the first magnetic component absorbs the second magnetic component corresponding to the first magnetic component, an electrical contact is made between one of the first conductive sheets and the second conductive sheet that is corresponding to the first conductive sheet.

20 Claims, 6 Drawing Sheets

WIRELESS ROUTER AND WIRELESS DEVICE

FIELD

The subject matter of the application generally relates to routers.

BACKGROUND

Wireless routers are popular. Wireless routers can operate in 2.4G wireless mode, 5G/5G AC wireless mode, bridge mode, etc. A router is connected to a plurality of logically separated networks. The router can be switched between various wireless modes by means of a settings webpage. Such methods of switching are restricting and inconvenient. In addition, the router may be inserted into the mother machine which is wall mounted on a protruding column on a bracket. However, assemble or disassemble the wall-mounting structure and the mother machine may be difficult.

Thus, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
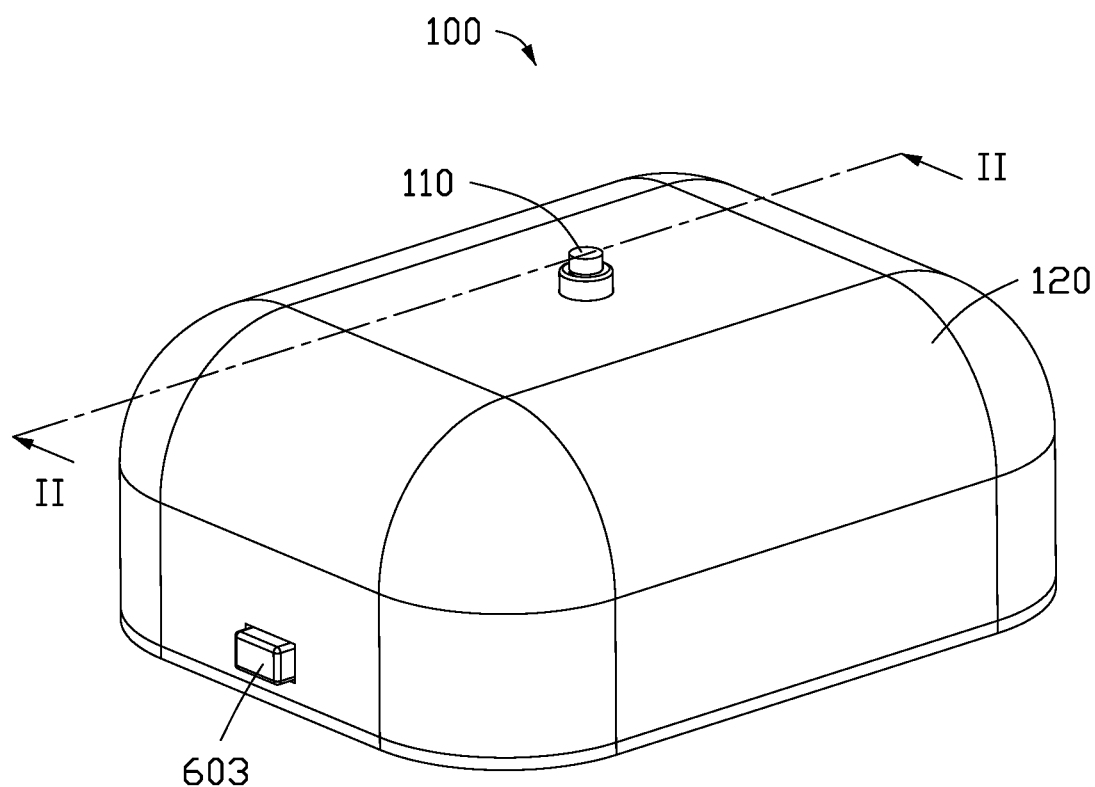
FIG. 1 is a perspective view of an embodiment of a wireless device according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
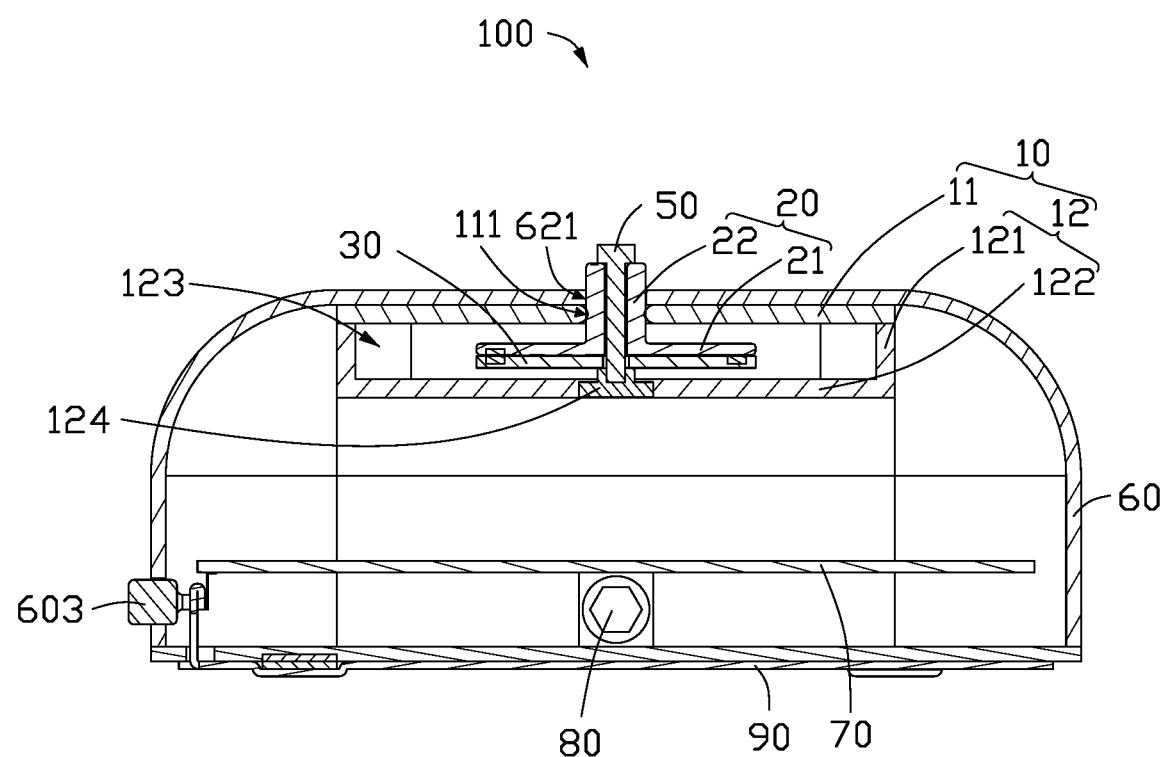
FIG. 2 is a cross-sectional view along line II-II of FIG. 1.
Figure 3:
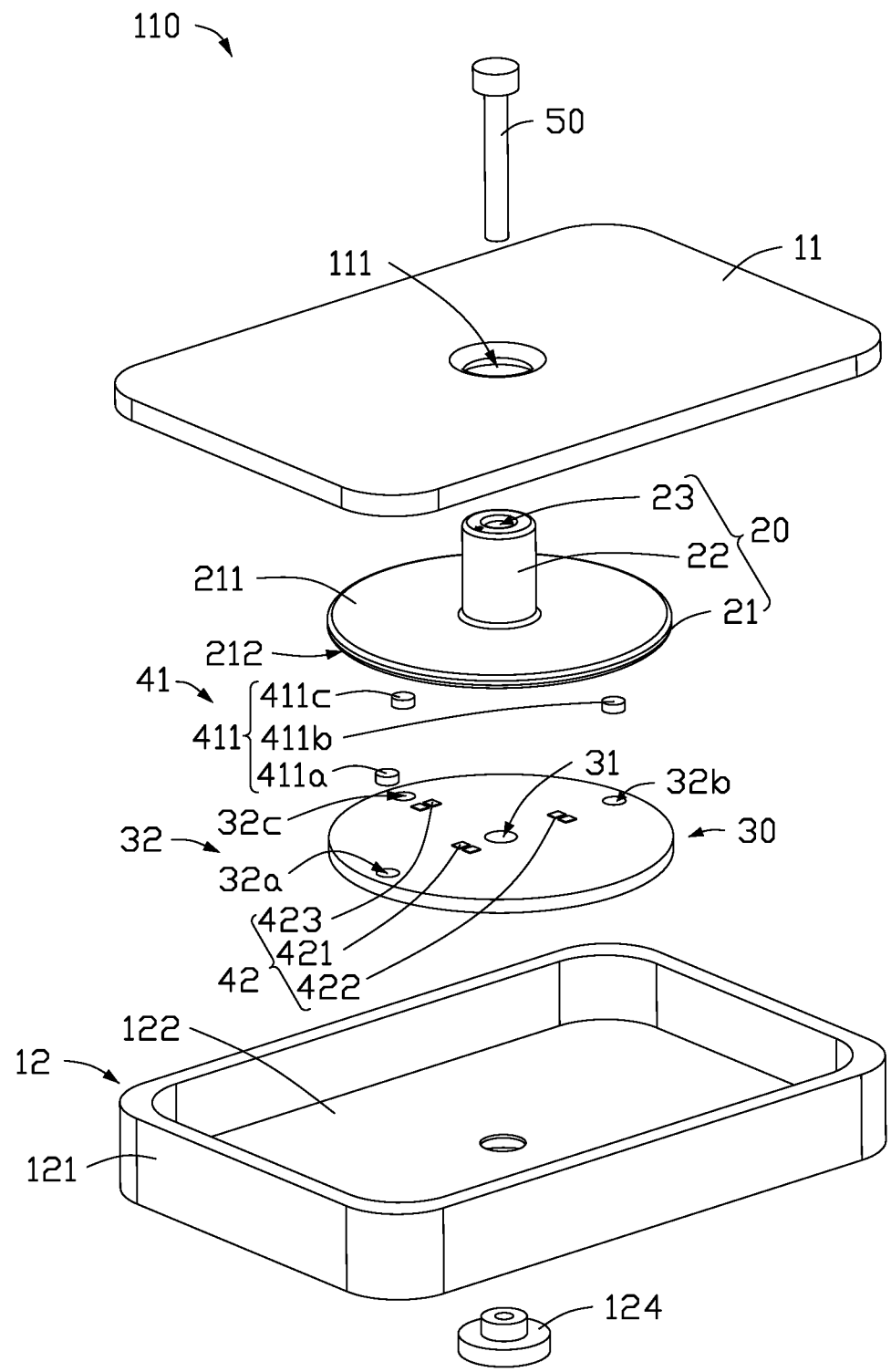
FIG. 3 is an exploded view of a router of the wireless device of FIG. 1.
Figure 4:
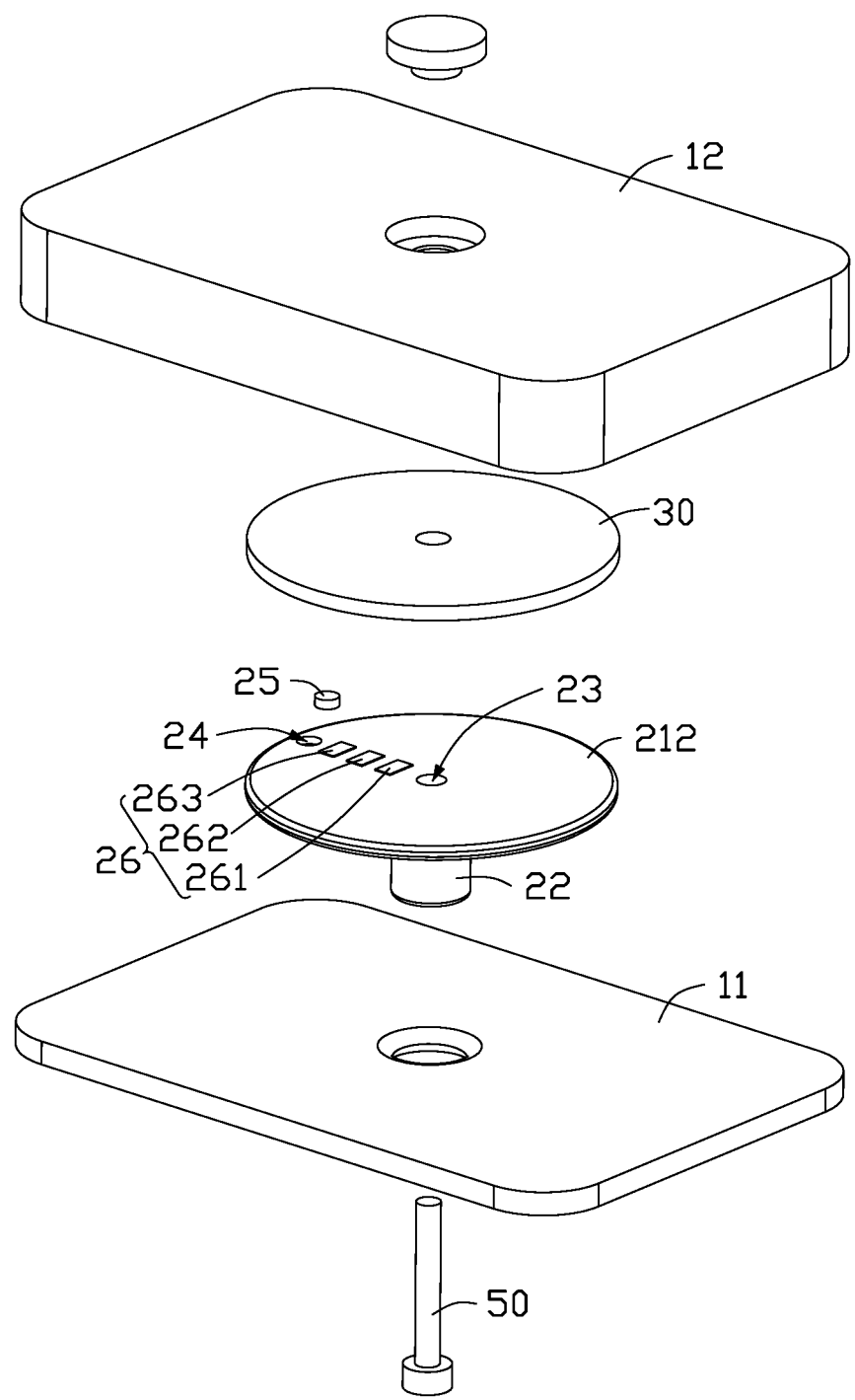
FIG. 4 is an exploded view of the wireless router of FIG. 3 from another angle.
Figure 5:
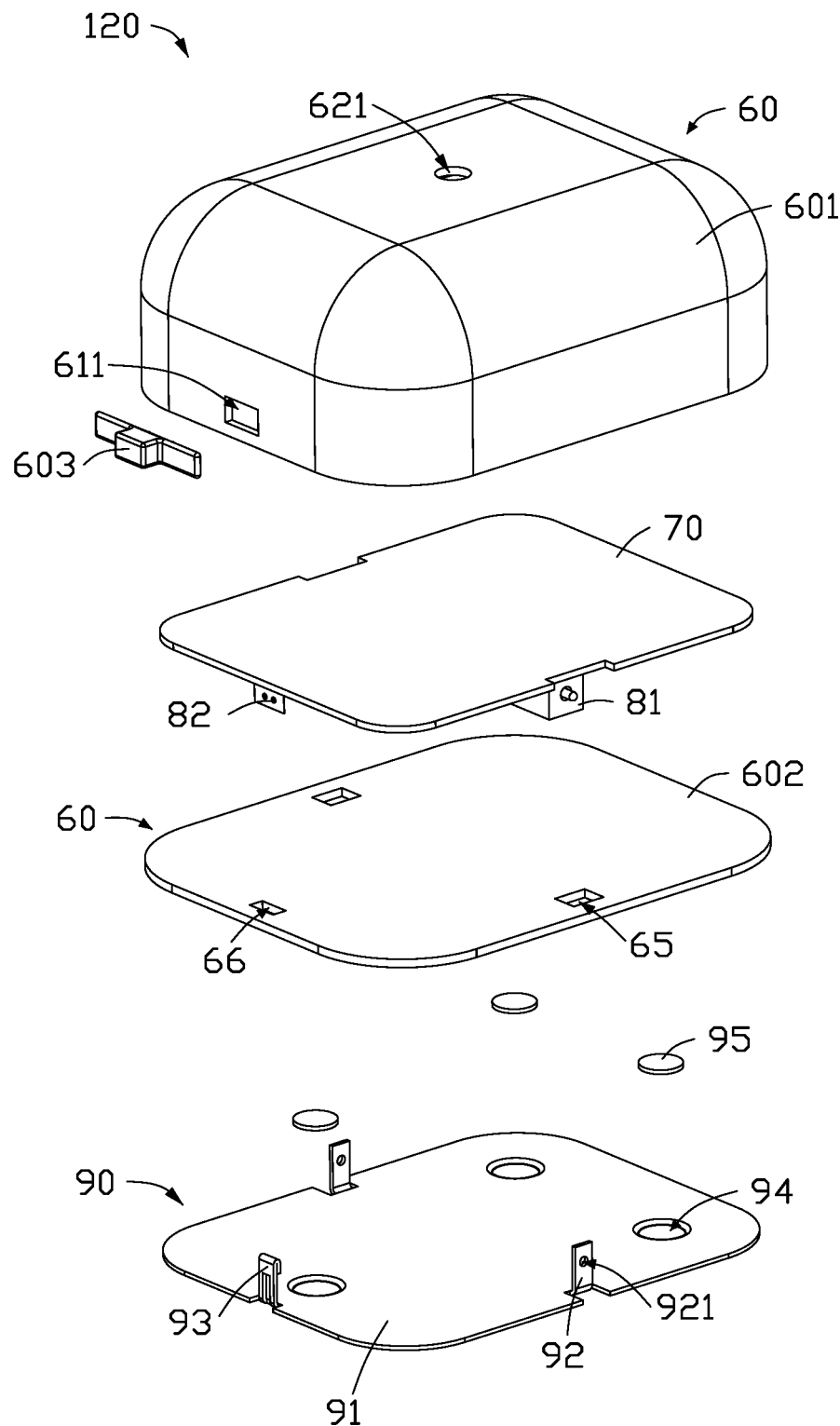
FIG. 5 is an exploded view of a wall-mounting module of the wireless device of FIG. 1.
Figure 6:
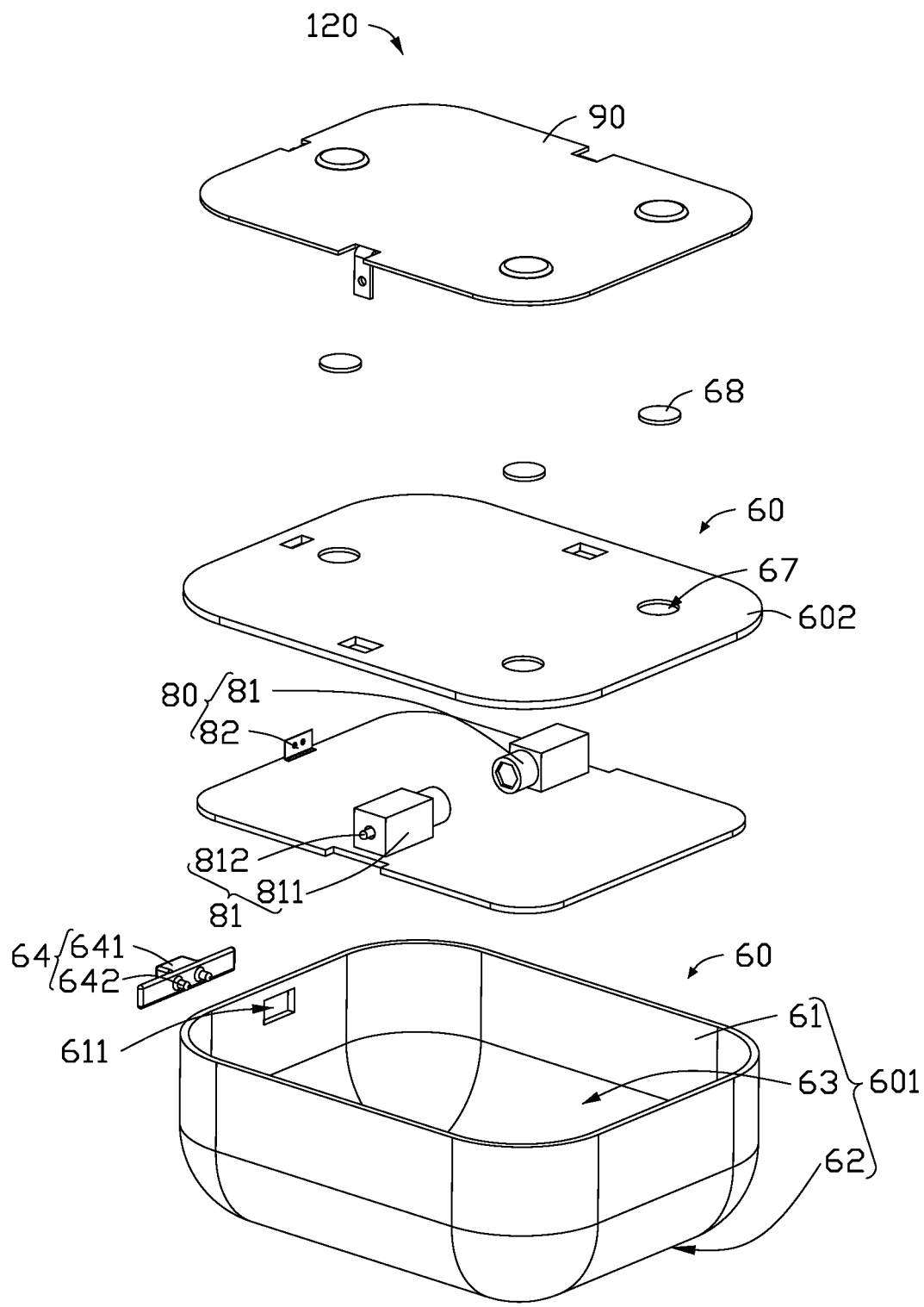
FIG. 6 is an exploded view of the wall-mounting module of FIG. 5 from another angle.

FIGS. 1-6 show embodiments of a wireless device 100. The wireless device 100 includes a wireless router 110 and a wall-mounting module 120. The wireless router 110 is received in the wall-mounting module 120.

The wireless router 110 has at least two wireless modes. Each wireless mode corresponds to a wireless area. In at least one embodiment, the wireless router 110 has three wireless modes.

The wireless router 110 includes a router shell 10, a rotatable disk 20, a first printed circuit board 30, and a disk button 50. The rotatable disk 20 and the first printed circuit board 30 are both received in the shell 10. The first printed circuit board 30 is installed on the rotatable disk 20. The disk button 50 passes through the rotatable disk 20 and the first printed circuit board 30. The disk button 50 can rotate the rotatable disk 20.

The router shell 10 includes a router upper lid 11 and a router bottom lid 12 installed on the router upper lid 11.

The router upper lid 11 includes a mounting hole 111.

The router bottom lid 12 includes a first side wall 121 and a first bottom wall 122. The first side wall 121 is mounted on the first bottom wall 122. A router receiving groove 123 is defined by the first side wall 121 and the first bottom wall 122. The rotatable disk 20, the first printed circuit board 30, and the disk button 50 are received in the router receiving groove 123.

The router bottom lid 12 further includes a fixing subassembly 124. The fixing subassembly 124 is embedded in the first bottom wall 122.

The rotatable disk 20 includes a substrate 21 and an axle 22 fixed on the substrate 21. In at least one embodiment, the axle 22 is fixed on the middle of the substrate 21. The substrate 21 includes a first surface 211 and a second surface 212 opposite to the first surface 211. The axle 22 is fixed on the first surface 211 perpendicularly. The end of the axle 22 away from the substrate 21 is received and fixed in the mounting hole 111.

The rotatable disk 20 further includes a first receiving hole 23. The first receiving hole 23 passes through the substrate 21 and the axle 22.

A first magnetic component receiving hole 24 is a through hole from the second surface 212 to the first surface 211. A first magnetic component 25 is fixed on the first magnetic component receiving hole 24.

In at least one embodiment, the first magnetic component receiving hole 24 is defined on the peripheral edge of the substrate 21.

The rotatable disk 20 further includes a first conductive sheet array 26 mounted on the second surface 212 of the substrate 21. The first conductive sheet array 26 is positioned between the first magnetic component receiving hole 24 and the first receiving hole 23. The first magnetic component receiving hole 24, the first conductive sheet array 26, and the first receiving hole 23 are in a straight line. The first conductive sheet array 26 includes at least two first conductive sheets. There is same number of first conductive sheets as there are wireless modes. There is a one-to-one correspondence between the conductive sheets and the wireless modes.

In at least one embodiment, the first conductive sheet array 26 includes three first conductive sheets, these being C-sheet 261, C-sheet 262, and C-sheet 263. The C-sheets 261, 262, and 263 are lined up with the first magnetic component receiving hole 24 and the first receiving hole 23.

In at least one embodiment, the substrate 21 is integrally formed with the axle 22. In other embodiments, the axle 22 can be attached to the substrate 21 by screw, adhesive, or the like.

The first printed circuit board 30 is positioned below the rotatable disk 20.

The first printed circuit board 30 includes a second receiving hole 31 passing through the first printed circuit board 30. The second receiving hole 31 is opposite to the first receiving hole 23.

The first printed circuit board 30 further includes at least two second magnetic component receiving holes 32. There is the same number of second magnetic component receiving holes 32 as there are wireless modes. There is a one-to-one correspondence between the second magnetic component receiving holes 32 and the wireless modes.

In at least one embodiment, the first printed circuit board 30 includes three second magnetic component receiving holes, 32a, 32b, and 32c. The three second magnetic component receiving holes, 32a, 32b, and 32c are all positioned on the peripheral edge of the first printed circuit board 30. The three second magnetic component receiving holes, 32a, 32b, and 32c correspond to the three wireless modes.

The wireless router 110 further includes a first magnetic component array 41. The first magnetic component array 41 includes at least two second magnetic components 411. The second magnetic components 411 are mounted in the second magnetic component receiving holes 32. There is the same number of second magnetic components 411 as there are second magnetic component receiving holes 32. There is a one-to-one correspondence between the second magnetic components 411 and the second magnetic component receiving holes 32.

In at least one embodiment, the first magnetic component array 41 includes three second magnetic components, 411a, 411b, and 411c. The three second magnetic components, 411a, 411b, and 411c are individually mounted in the second magnetic component receiving holes.

The wireless router 110 further includes a second conductive sheet array 42 mounted on the first printed circuit board 30. The second conductive sheet array 42 includes at least two second conductive sheets. There is same number of second conductive sheets as there are first conductive sheets.

In at least one embodiment, the second conductive sheet array 42 includes three second conductive sheets, these being C-sheet 421, C-sheet 422, and C-sheet 423. To change the wireless mode, the disk button 50 can rotate C-sheet 261 so that electrical contact is made with C-sheet 421. The disk button 50 can also rotate so that electrical contact is made between C-sheet 262 and C-sheet 422. The disk button 50 can further be rotated so that electrical contact is made between C-sheet 263 and C-sheet 423.

One end of the disk button 50 passes through the first receiving hole 23 and the second receiving hole 31 and is fixed in the fixing subassembly 124. The other end of the disk button 50 protrudes from the first receiving hole 23. The disk button 50 being rotated drives the rotatable disk 20 to rotate.

An indicating arrow (not shown) is formed in the other end of the disk button 50. The indicating arrow indicates the current wireless mode of the wireless router 110.

The wall-mounting module 120 includes a wall-mounting shell 60, a second printed circuit board 70, a bodykit module 80, and a wall-mounting shelf 90. The second printed circuit board 70 and the bodykit module 80 are received in the wall-mounting shell 60. The bodykit module 80 is fixed on and electrically connected to the second printed circuit board 70. The wall-mounting shelf 90 is fixed on the wall-mounting shell 60 and opposite to the bodykit module 80.

The wall-mounting shell 60 includes a wall-mounting upper lid 601 and a wall-mounting bottom lid 602 fixed on the wall-mounting upper lid 601.

The wall-mounting upper lid 601 includes a second side wall 61 and a second bottom wall 62. The second side wall 61 is fixed on the second bottom wall 62. The second side wall 61 and the second bottom wall 62 define a wall-mounting receiving groove 63. The second printed circuit board 70 and the wireless router 110 are received in the wall-mounting receiving groove 63.

The wall-mounting upper lid 601 further includes a first mounting hole 611 passing through the second side wall 61 and a second mounting hole 621 passing through the second bottom wall 62. The axle 22 of the rotatable disk 20 of the wireless router 110 is fixed on the second mounting hole 621 and protrudes out of the second mounting hole 621.

The wall-mounting bottom lid 602 further includes two first through holes 65, a second through hole 66, and at least two third magnetic component receiving holes 67. The two first through holes 65 are opposite to each other. The two first through holes 65 and the second through hole 66 are all positioned in a triangular shape on the peripheral edge of the wall-mounting bottom lid 602. In at least one embodiment, the triangular shape is that of an isosceles triangle. In at least one embodiment, the wall-mounting bottom lid 602 includes three third magnetic component receiving holes 67. One of the three third magnetic component receiving holes 67 abuts the second through hole 66, the other two of the three third magnetic component receiving holes 67 are arranged in a straight line. The three third magnetic component receiving holes 67 are distributed in an isosceles triangle. Each of the third magnetic component receiving holes 67 is provided with a third magnetic component 68.

The wall-mounting shell 60 further includes a pushing button 603 received in the first mounting hole 611. The pushing button 603 includes a pressing portion 641 and an actuating portion 642 formed on the pressing portion 641. The pressing portion 641 is mounted in the first mounting hole 611 and protrudes out of the first mounting hole 611. The actuating portion 642 is received in the wall-mounting receiving groove 63.

In at least one embodiment, the actuating portion 642 is two parallel elastic pieces. The actuating portion 642 is integrally formed with the pressing portion 641.

In other embodiments, the actuating portion 642 may be fixed on the pressing portion 641 by adhesive, screw, or the like.

The second printed circuit board 70 includes a mounting surface 71. The mounting surface 71 faces the wall-mounting bottom lid 602.

The bodykit module 80 is fixed on the mounting surface 71. The bodykit module 80 includes two bodykits 81 and a bodykit elastic strip 82. The two bodykits 81 and the bodykit elastic strip 82 are all fixed on the mounting surface 71. The two bodykits 81 and the bodykit elastic strip 82 are arranged in a triangle. The two bodykits 81 are opposite to the two first through holes 65. The bodykit elastic strip 82 is opposite to the second through hole 66. The two bodykits 81 are electrically connected to the second printed circuit board 70. The bodykit elastic strip 82 is interconnected to the two bodykits 81.

Each of the two bodykits 81 includes a body portion 811 and a convex shaft 812 mounted on one end of the body portion 811. The convex shafts 81 of the two bodykits 81 are positioned away from each other.

The wall-mounting shelf 90 includes a wall-mounting shelf body 91, two bodykit fixed blocks 92, and a touching elastic strip 93. The two bodykit fixed block 92 and the touching elastic strip 93 are fixed on the wall-mounting shelf body 91. The touching elastic strip 93 passes through the second through hole 66 and is opposite to the bodykit elastic strip 82. The two bodykit fixed blocks 92 pass through the two first through holes 65 and are opposite to the convex shafts 812 of the two bodykits 81. The bodykit fixed block 92 includes a bodykit fixed hole 921 opposite to the convex shaft 812.

In at least one embodiment, the two bodykit fixed blocks 92 and the touching elastic strip 93 are integrally formed with the wall-mounting shelf body 91. In other embodiments, the two bodykit fixed blocks 92 and the touching elastic strip 93 can be attached on the wall-mounting shelf body 91 and by screw, adhesive, or the like.

The wall-mounting shelf 90 further includes at least two fourth magnetic component receiving holes 94. The at least two fourth magnetic component receiving holes 94 are opposite to the at least two third magnetic component receiving holes 67. Each of the at least two fourth magnetic component receiving holes 94 is provided with a fourth magnetic component 95. The third magnetic components 68 absorb the fourth magnetic components 95 for fixing the wall-mounting bottom lid 602 on the wall-mounting shelf body 91.

The first magnetic component 25, the three second magnetic components 411, 412, 413, the third magnetic component 68, and fourth magnetic components 95 may be actual magnets or other magnetic components. In at least one embodiment, the first magnetic component 25, the three second magnetic components 411, 412, 413, the third magnetic component 68, and fourth magnetic components 95 are magnets.

In at least one embodiment, number of the fourth magnetic component receiving holes 94 is three.

Assembly of the wireless device 100 includes, firstly, positioning the first printed circuit board 30 between the rotatable disk 20 and the fixing subassembly 124.

The axle 22 of the rotatable disk 20 passes through the mounting hole 111 of the router upper lid 11. The disk button 50 passes through the first receiving hole 23 and the second receiving hole 31 and is fixed in the fixing subassembly 124 and fixes the router upper lid 11 on the router bottom lid 12 to avoid touches by mistake. When the disk button 50 is driven to a wireless mode, the first magnetic component 25 absorbs the one of the three second magnetic components 411, 412, 413 which corresponds to the desired wireless mode. So, not only the stability of the wireless mode can be ensured, but also the desired wireless mode can be quickly located. The making of electrical contact between one of the C-sheets 261, 262, and 263 and one of the C-sheets 421, 422, and 423 corresponding to the desired wireless mode realizes the function of the wireless router 110. Secondly, the axle 22 of the rotatable disk 20 passes through and is fixed on the second mounting hole 621 of the second bottom wall 62. Thirdly, the second printed circuit board 70 is installed in the second side wall 61 of the wall-mounting shell 60. The wall-mounting bottom lid 602 is fixed on the wall-mounting upper lid 601. The wall-mounting shelf body 91 of the wall-mounting shelf 90 is fixed on the wall-mounting bottom lid 602 by the third magnetic components 68 and the fourth magnetic components 95. The two bodykit fixed blocks 92 pass through the two first through holes 65, extend to the wall-mounting receiving groove 63, and are opposite to the convex shafts 812. The touching elastic strip 93 passes through the second through hole 66, extends to the wall-mounting receiving groove 63, and is positioned between the bodykit elastic strip 82 and the actuating portion 642 of the pushing button 603. When pushing the pushing button 603, the actuating portion 642 of the pushing button 603 forces the touching elastic strip 93 against the bodykit elastic strip 82, and then, the bodykit elastic strip 82 sends a locking signal to the two bodykits 81. Thereby, the convex shafts 812 of the two bodykits 81 lock in the bodykit fixed holes 921 of the bodykit fixed blocks 92. When repeating a press on the pushing button 603, the actuating portion 642 of the pushing button 603 keeps away from the touching elastic strip 93, the touching elastic strip 93 does not touch the bodykit elastic strip 82, and then, the bodykit elastic strip 82 sends an unlocking signal to the two bodykits 81. Thereby the convex shafts 812 of the two bodykits 81 detach from the bodykit fixed holes 921 of the bodykit fixed blocks 92 to release the locking.

With the embodiments described above, firstly, the wireless device 100 can be switched to different wireless modes by rotating the disk button 50 to different wireless modes. Secondly, the wireless device 100 can achieve rapid positioning by the first magnetic component 25 on the rotatable disk 20 to absorb different magnetic components of the first magnetic component array 41. Thirdly, the bodykit module 80 and the wall-mounting shelf 90 enable quick disassembly and reassembly of the wall-mounting component 120 and the wireless router 110. Fourthly, magnetic components on the wall-mounting shelf 90 and the wall-mounting bottom lid 602 provide a strong attachment of the wall-mounting shelf 90 on the wall-mounting bottom lid 602.

The embodiments shown and described above are only examples. Many details are often found in the art such as the other features of a wireless device. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A wireless router, comprising:
 a rotatable disk, a first magnetic component and a first conductive sheet array fixed on the rotatable disk; the first conductive sheet array comprising at least two first conductive sheets; and
 a first printed circuit board, a first magnetic component array and a second conductive sheet array fixed on the first printed circuit board; the first magnetic component array comprising at least two second magnetic components; the second conductive sheet array comprising at least two second conductive sheets, wherein
 the wireless router is configured to be switched between at least two wireless modes by rotating the rotatable disk to one of the wireless modes, the first magnetic component absorbs the second magnetic component corresponding to the first magnetic component, an electrical contact is made between one of the first conductive sheets and the second conductive sheet that is corresponding to the first conductive sheet.

2. The wireless router of claim 1, wherein the wireless router further comprises a router shell, the first printed circuit board and the rotatable disk are received in the router shell; the router shell comprises a router upper lid, the router upper lid comprises a mounting hole, the rotatable disk comprises a axle, the axle is received and fixed in the mounting hole.

3. The wireless router of claim 2, wherein the router shell further comprises a router bottom lid fixed on the router upper lid, the router bottom lid comprises a first bottom wall and a fixing subassembly embedded in the first bottom wall, the wireless router further comprises a disk button, an end of the disk button is fixed in the axle and passes through the first printed circuit board and is received in the fixing subassembly.

4. The wireless router of claim 3, wherein an indicating arrow is formed in the other end of the disk button, the indicating arrow indicates the wireless mode of the wireless router.

5. The wireless router of claim 2, wherein the rotatable disk further comprises a substrate, the axle is fixed on the substrate; the rotatable disk further comprises a first receiving hole passes through the substrate and the axle; the disk button is fixed in the first receiving hole and protrudes from the first receiving hole.

6. The wireless router of claim 5, wherein a first magnetic component receiving hole is formed on the substrate, the first magnetic component receiving hole is away from the axle, the first magnetic component is mounted in the first magnetic component receiving hole; the first magnetic component receiving hole, the first conductive sheet array, and the first receiving hole are arranged in a straight line.

7. The wireless router of claim 6, wherein the at least two first conductive sheets are arranged to line up with the first magnetic component receiving hole and the first receiving hole.

8. A wireless device, comprising:
a router, the router comprising:
  a rotatable disk, wherein a first magnetic component and a first conductive sheet array are fixed on the rotatable disk; the first conductive sheet array comprises at least two first conductive sheets;
  a first printed circuit board, wherein a first magnetic component array and a second conductive sheet array are fixed on the first printed circuit board; the first magnetic component array comprises at least two second magnetic components; the second conductive sheet array comprises at least two second conductive sheets;
wherein
  the wireless router is configured to be switched between at least two wireless modes by rotating the rotatable disk to one of the wireless modes, the first magnetic component absorbs the second magnetic component corresponding to the first magnetic component, an electrical contact is made between one of the first conductive sheets and the second conductive sheet that is corresponding to the first conductive sheet; and
  a router shell, wherein the first printed circuit board and the rotatable disk are both received in the router shell; the router shell comprises a router upper lid, the router upper lid comprises a mounting hole, the rotatable disk comprises an axle, the axle is received and fixed in the mounting hole; and
  a wall-mounting module; the router being received in the wall-mounting module; the axle of the rotatable disk fixed in and protruding out of the wall-mounting module.

9. The wireless device of claim 8, wherein the wall-mounting module comprises a wall-mounting shell, a second printed circuit board, a bodykit module, and a wall-mounting shelf, the second printed circuit board and the bodykit module are received in the wall-mounting shell, the bodykit module is fixed on and electrically connected to the second printed circuit board, the wall-mounting shelf is fixed on the wall-mounting shell and opposite to the bodykit module.

10. The wireless device of claim 9, wherein the wall-mounting shell comprises a wall-mounting upper lid, the wall-mounting upper lid comprises a second side wall and a second bottom wall, the second side wall is fixed on the second bottom wall, the second side wall and the second bottom wall define a wall-mounting receiving groove, the router are received in the wall-mounting receiving groove.

11. The wireless device of claim 10, wherein the wall-mounting upper lid further comprises a first mounting hole passing through the second side wall and a second mounting hole passing through the second bottom wall, the axle of the rotatable disk of the wireless router is fixed on the second mounting hole and protrudes out of the second mounting hole.

12. The wireless device of claim 11, wherein the wall-mounting shell further comprises a pushing button received in the first mounting hole, the pushing button comprises a pressing portion and an actuating portion formed on the pressing portion, the pressing portion is mounted in the first mounting hole and protrudes out of the first mounting hole, the actuating portion is received in the wall-mounting receiving groove.

13. The wireless device of claim 12, wherein the bodykit module comprises two bodykits and a bodykit elastic strip, the two bodykits and the bodykit elastic strip are all fixed on the second printed circuit board, the two bodykits are electrically connected to the second printed circuit board, the bodykit elastic strip is interconnected to the two bodykits; each of the two bodykits comprises a convex shaft.

14. The wireless device of claim 13, wherein the wall-mounting shelf comprises two bodykit fixed blocks and a touching elastic strip, the touching elastic strip passes through the second through hole and is opposite to the bodykit elastic strip, the two bodykit fixed blocks pass through the two first through holes and is opposite to the convex shafts of the two bodykits; when pushing the pushing button, the actuating portion touches against the touching elastic strip to make the touching elastic strip to touch against the bodykit elastic strip, the bodykit elastic strip sends a locking signal to the two bodykits, the convex shafts of the two bodykits lock in the bodykit fixed holes; when pushing the pushing button again, the actuating portion keeps away from the touching elastic strip, the touching elastic strip does not touch the bodykit elastic strip, the bodykit elastic strip sends a unlocking signal to the two bodykits, the convex shafts detach from the bodykit fixed holes to release the locking.

15. The wireless device of claim 14, wherein the wall-mounting shell further comprises a wall-mounting bottom lid fixed on the wall-mounting upper lid, the wall-mounting bottom lid further comprises at least two third magnetic component receiving holes, each of the third magnetic component receiving holes is provided with a third magnetic component; the wall-mounting shelf further comprises a wall-mounting shelf body, the two bodykit fixed block and the touching elastic strip are fixed on the wall-mounting shelf body, the wall-mounting shelf further comprises at least two fourth magnetic component receiving holes, each of the at least two fourth magnetic component receiving holes is provided with a fourth magnetic components; the fourth magnetic components absorbs the third magnetic components.

16. The wireless device of claim 14, wherein the two bodykits and the bodykit elastic strip are arranged in a triangle, the two bodykits are opposite to the two first through holes, the bodykit elastic strip is opposite to the second through hole.

17. The wireless device of claim 8, wherein the router shell further comprises a router bottom lid fixed on the router upper lid, the router bottom lid comprises a first bottom wall and a fixing subassembly embedded in the first bottom wall, the router further comprises a disk button, an end of the disk button is fixed in the axle and passes through the first printed circuit board and is received in the fixing subassembly.

18. The wireless device of claim 17, wherein an indicating arrow is formed in the other end of the disk button, the indicating arrow indicates the wireless mode of the wireless router.

19. The wireless device of claim 8, wherein the rotatable disk further comprises a substrate, the axle is fixed on the substrate; the rotatable disk further comprises a first receiving hole passes through the substrate and the axle; the disk button is fixed in the first receiving hole and protrudes from the first receiving hole.

20. The wireless device of claim 19, wherein a first magnetic component receiving hole is formed on the substrate, the first magnetic component receiving hole is away from the axle, the first magnetic component is mounted in the first magnetic component receiving hole; the first magnetic component receiving hole, the first conductive sheet array, and the first receiving hole are arranged in a straight line.

* * * * *